(12) United States Patent
Wang et al.

(10) Patent No.: US 10,342,155 B2
(45) Date of Patent: Jul. 2, 2019

(54) FINGER CLIP CABLE MANAGEMENT ASSEMBLY

(71) Applicant: CommScope Technologies LLC, Hickory, NC (US)

(72) Inventors: Jing Wang, Jiangsu (CN); Wenyong Wu, Jiangsu (CN)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/647,812

(22) Filed: Jul. 12, 2017

(65) Prior Publication Data
US 2018/0020569 A1    Jan. 18, 2018

(30) Foreign Application Priority Data
Jul. 13, 2016    (CN) .......................... 2016 1 0550643

(51) Int. Cl.
| | |
|---|---|
| *H05K 7/14* | (2006.01) |
| *H04Q 1/06* | (2006.01) |
| *H05K 7/18* | (2006.01) |
| *H04Q 1/02* | (2006.01) |
| *H01R 9/24* | (2006.01) |
| *H01R 35/04* | (2006.01) |

(52) U.S. Cl.
CPC ........... *H05K 7/1491* (2013.01); *H04Q 1/023* (2013.01); *H04Q 1/06* (2013.01); *H04Q 1/062* (2013.01); *H05K 7/183* (2013.01); *H05K 7/186* (2013.01); *H01R 9/2416* (2013.01); *H01R 35/04* (2013.01)

(58) Field of Classification Search
None
See application file for complete search history.

(56) References Cited

U.S. PATENT DOCUMENTS

| | | | | |
|---|---|---|---|---|
| 6,315,249 B1* | 11/2001 | Jensen | ................. | H05K 7/1491 248/49 |
| 6,468,112 B1* | 10/2002 | Follingstad | .......... | G02B 6/4452 385/135 |
| 7,022,916 B1* | 4/2006 | Cavanaugh | .......... | H05K 7/1491 174/100 |
| 8,730,678 B1* | 5/2014 | Cunningham | ....... | H05K 7/1491 174/72 A |
| 9,069,149 B2* | 6/2015 | Yu | ......................... | G02B 6/3898 |
| 2004/0094491 A1* | 5/2004 | Smith | .................. | G02B 6/4452 211/26 |

(Continued)

FOREIGN PATENT DOCUMENTS

| | | |
|---|---|---|
| CN | 104051873 A | 9/2014 |
| WO | 2014/150795 A1 | 9/2014 |
| WO | 2017/176879 A1 | 10/2017 |

*Primary Examiner* — Binh B Tran
*Assistant Examiner* — Douglas R Burtner
(74) *Attorney, Agent, or Firm* — Merchant & Gould P.C.

(57) ABSTRACT

One aspect of the present disclosure relates to a finger clip for providing controlled cable access to a cable routing aperture through a gap defined between adjacent first and second cable management members. The finger clip can be constructed and arranged for slidable engagement with at least one of a first extension of the first cable management member and a second extension of the second cable management member such that the finger clip can slide between an open position in which the gap is unobscured by the main body and a closed position in which the gap is closed by the main body.

16 Claims, 5 Drawing Sheets

(56) References Cited

U.S. PATENT DOCUMENTS

| | | | | |
|---|---|---|---|---|
| 2006/0171651 A1* | 8/2006 | Laursen | ............... | H04Q 1/064 |
| | | | | 385/135 |
| 2007/0210686 A1* | 9/2007 | Adducci | ............... | A47B 81/00 |
| | | | | 312/265.2 |
| 2007/0221393 A1* | 9/2007 | Adducci | ............... | E05C 9/043 |
| | | | | 174/50 |
| 2007/0293138 A1* | 12/2007 | Adducci | ............... | H05K 7/186 |
| | | | | 454/184 |
| 2009/0059552 A1* | 3/2009 | Womack | ............... | H04Q 1/064 |
| | | | | 361/826 |
| 2009/0090533 A1* | 4/2009 | Jones | ............... | H02G 3/0456 |
| | | | | 174/95 |
| 2010/0133391 A1* | 6/2010 | Taylor | ............... | H04Q 1/06 |
| | | | | 248/68.1 |
| 2011/0228473 A1* | 9/2011 | Anderson | ............ | G02B 6/4452 |
| | | | | 361/679.58 |
| 2012/0273438 A1* | 11/2012 | Nordin | ............... | H04Q 1/025 |
| | | | | 211/26 |
| 2014/0097000 A1* | 4/2014 | Lin | ............... | H02G 11/00 |
| | | | | 174/135 |
| 2016/0061354 A1* | 3/2016 | Abby | ............... | G02B 6/4457 |
| | | | | 211/85.5 |
| 2017/0118863 A1* | 4/2017 | Miwa | ............... | H02G 3/0406 |
| 2017/0150636 A1* | 5/2017 | Segroves | ............ | H05K 7/1489 |
| 2017/0245389 A1* | 8/2017 | Chen | ............... | F16L 3/015 |
| 2018/0020269 A1* | 1/2018 | Smith | ............... | H04Q 1/06 |

\* cited by examiner

FINGER CLIP CABLE MANAGEMENT ASSEMBLY

RELATED APPLICATIONS

This application claims priority to Chinese Patent Application Serial Number 201610550643.2 entitled Finger Clip Cable Management Assembly and filed on Jul. 13, 2016, the entirety of which is incorporated by reference herein.

FIELD OF THE INVENTION

The present invention relates to cable management systems for telecommunications cables.

BACKGROUND OF THE INVENTION

Telecommunications racks are sometimes provided with cable management members to aid in routing and securing the cables that are connected to equipment mounted within the racks. In some applications, the cables are routed through gaps between the cable management members and into cable routing apertures. Under certain conditions, the installed cables can undesirably migrate out of the cable routing apertures through the gaps and become loose and unsecured. Improvements are desired.

SUMMARY OF THE INVENTION

One aspect of the present disclosure relates to a finger clip for providing controlled cable access to a cable routing aperture through a gap defined between adjacent first and second cable management members. The finger clip can include a main body extending from a first end to a second end. An attachment portion and a position retaining portion, formed as parts of the main body may also be provided. The attachment portion can be constructed and arranged for slidable engagement with at least one of a first extension of the first cable management member and a second extension of the second cable management member such that the main body can slide between an open position in which the gap is unobscured by the main body and a closed position in which the gap is closed by the main body. The position retaining member can be constructed and arranged to retain the finger clip in the open and/or closed position.

The disclosure is also directed to a cable arrangement assembly for a telecommunications rack including the finger clip, a first cable management member defining a first extension, and a second cable management member defining a second extension. The first and second cable management members together define a cable routing aperture that can be accessed by a cable through a gap defined between the first and second extensions. The finger clip is slidably engaged with one or both of the first and second extensions and movable between an open position in which the gap is unobscured by the finger clip and a closed position in which the gap is closed by the finger clip.

A method of installing and securing cables in a telecommunications rack is also disclosed and can include the steps of: providing adjacent first and second cable management members respectively defining first and second extensions that form a gap, wherein the first and second cable management members define a cable routing aperture accessible through the gap; sliding a finger clip attached to one or both of the first and second extensions into an open position such that the gap is unobscured by the finger clip; inserting one or more cables into the cable routing aperture through the gap; and sliding the finger clip into a closed position in which the gap is blocked by the finger clip, thereby securing the cables within the cable routing aperture.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
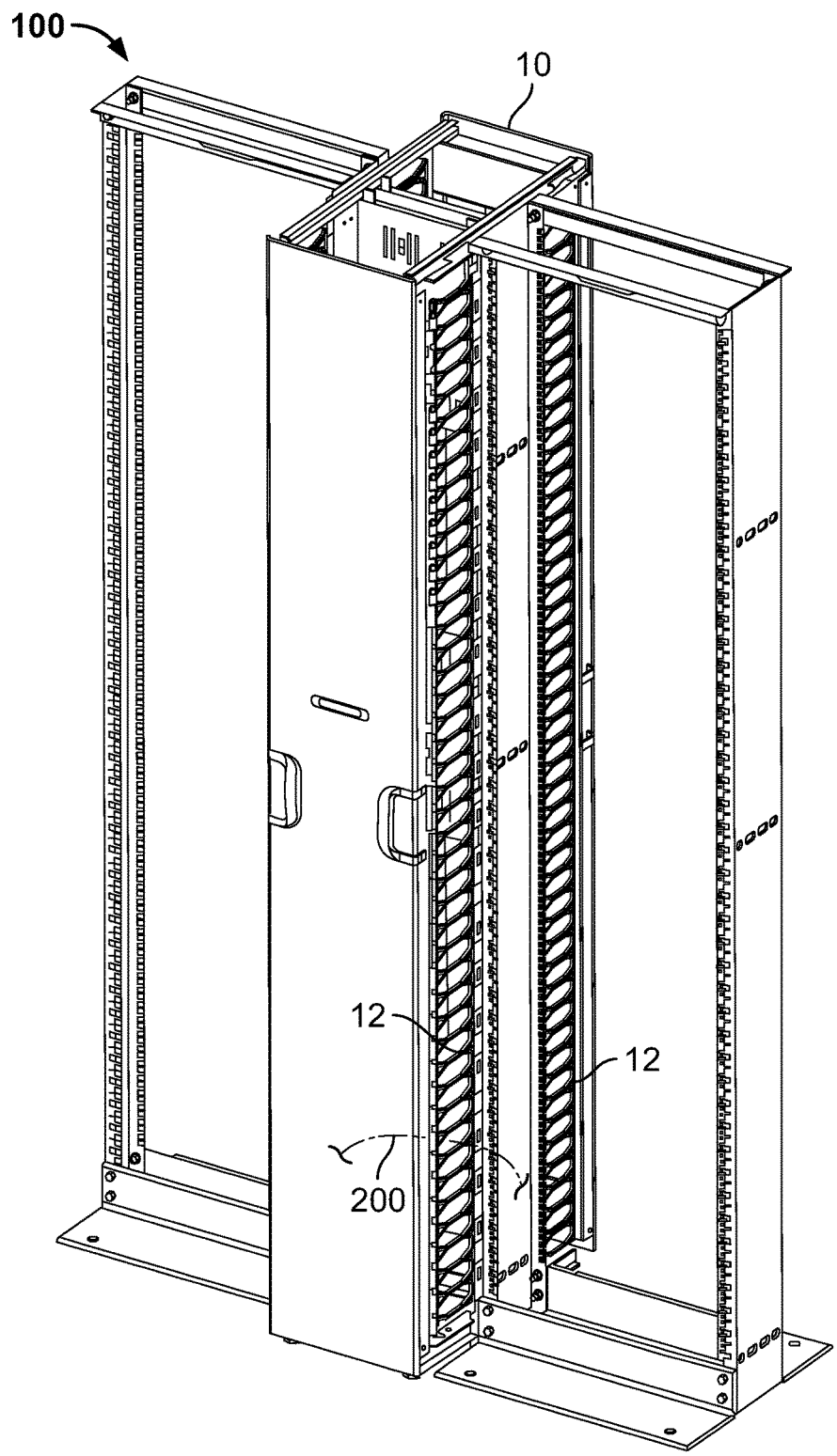
FIG. 1 is a top perspective view of an example cable management assembly in accordance with principles of the present disclosure.
Figure 2:
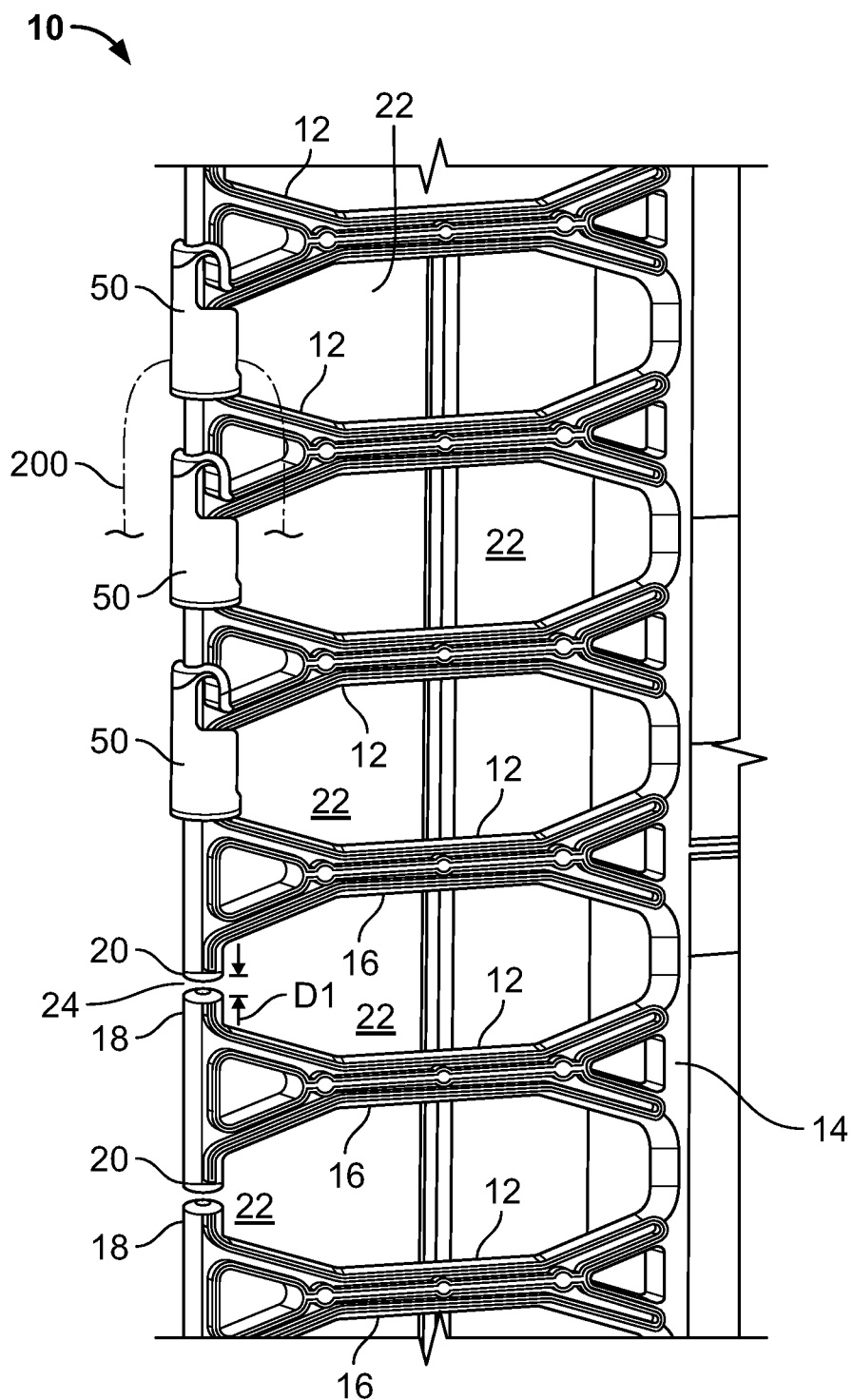
FIG. 2 is an enlarged portion of the cable management assembly shown in FIG. 1.

A cable management assembly 100 for a telecommunications rack or cabinet 10 for managing cable in and around telecommunications equipment racks and cabinets is disclosed. In one example, the rack or cabinet 10 is provide with a plurality of cable management members 12 which can be used to manage cables 200 routed between the telecommunications components installed within the rack 10. In one example, the cables 200 are copper based telecommunications cables (i.e. Category 5 cables) and are provided with RJ type plugs that are connected to respective jacks of the telecommunications components. Many other types of assemblies, cables, and connectors are possible, such as fiber optic cables with LC, SC, and/or MPO connectors.

In the example presented, a plurality of cable management members 12 is provided in an adjacent relationship to form a single row array. Examples of cable management member arrays is shown in U.S. Provisional Application Ser. No. 62/319,890 entitled CABLE MANAGEMENT ASSEMBLY and filed on Apr. 8, 2016, the entirety of which is incorporated by reference herein. Each of the cable management members 12 is shown as being provided with a base portion 14 for connecting the cable management member 12 to the rack 10 or to an intermediate structure connected to the rack 10. A support member 16 is shown as extending from the base portion 14 to an upper and lower extension member 18, 20. The support members 16 of adjacent cable management members 12 form a cable routing aperture 22 within which cables 200 can be routed and secured.

The cables 200 can be installed into and removed from the cable routing aperture 22 through a gap 24 formed between the adjacent cable management members 12. The gap 24 is specifically formed between an upper extension member 18 of one cable management member 12 and the lower extension member 20 of an adjacent upper cable management member 12. The gap 24 can have an opening dimension D1. The cable management members 12 can be provided with sufficient flexibility such that they can be laterally deflected to increase the size of the gap 24 and dimension D1. In some cases, for example where the dimension D1 is greater than a diameter of the cables 200, the cables 200 can be inserted through the gap 24 without deflection of the cable management member 12.

Figure 5:
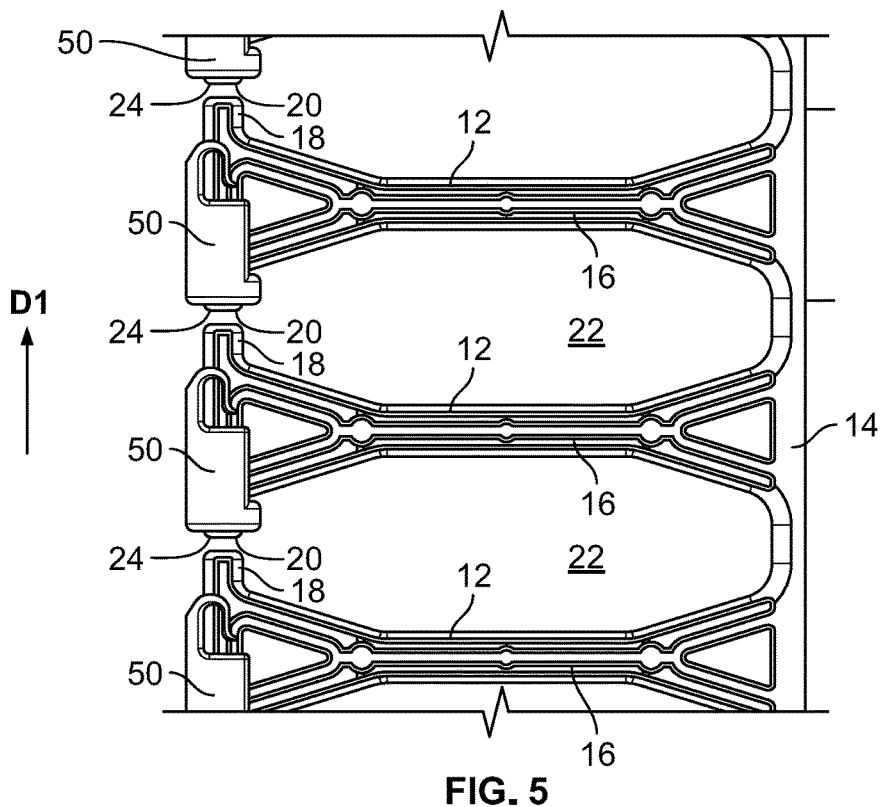
FIG. 5 is a side view of a portion of the cable management assembly shown in FIG. 1 with a plurality of finger clips being oriented in an open position.
Figure 6:
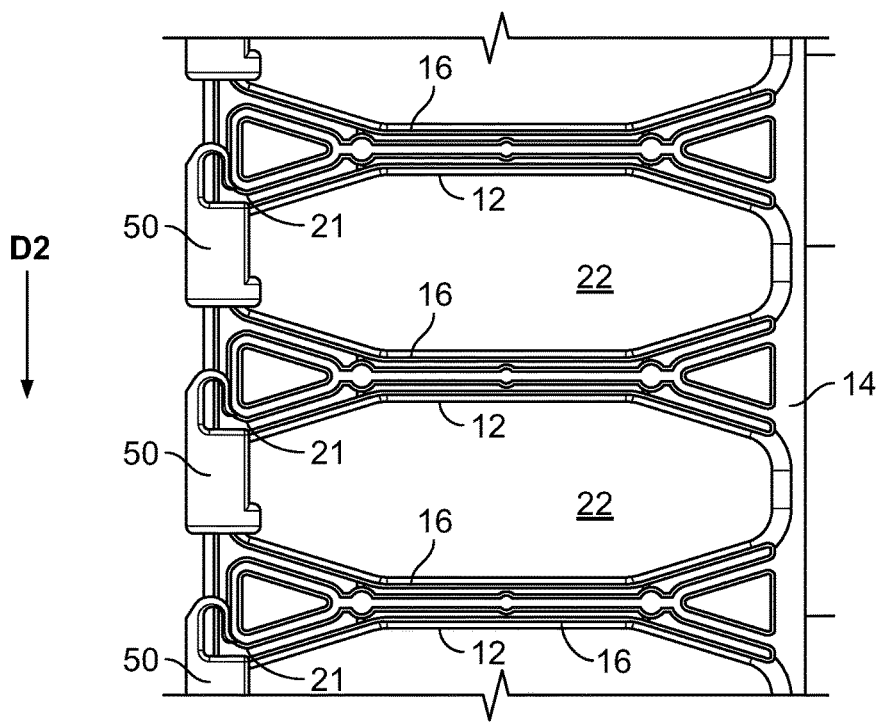
FIG. 6 is a side view of a portion of the cable management assembly shown in FIG. 1 with a plurality of finger clips being oriented in a closed position.
Figure 7:
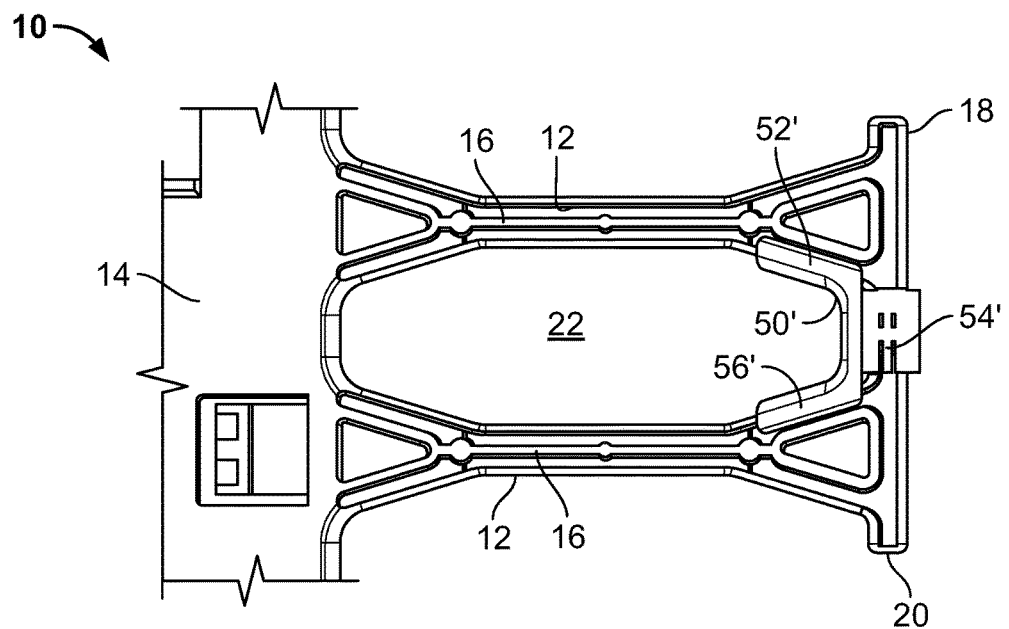
FIG. 7 is a side view of a portion of an example cable management assembly in accordance with principles of the present disclosure with a second example of a finger clip installed.
Figure 8:
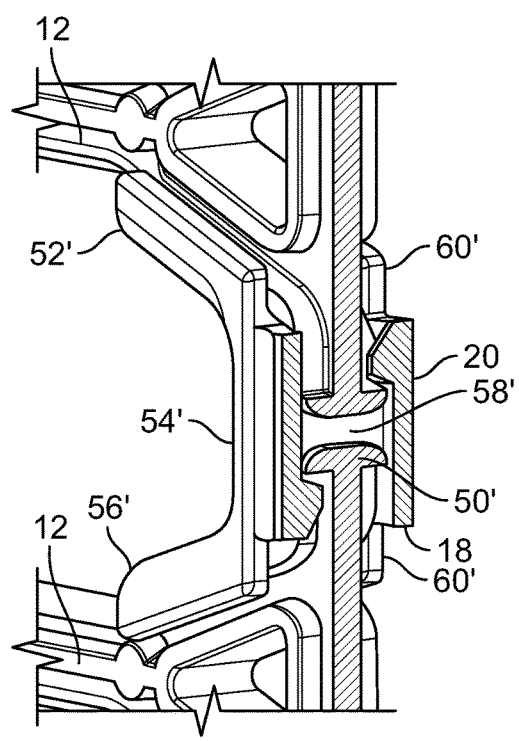
FIG. 8 is an enlarged perspective view of a portion of the assembly shown in FIG. 7.

Selective access to the cable routing apertures 22 through the gaps 24 can be provided by a finger clip 50 which is movable between an open position and a closed position. In the open position of the finger clip 50, the gap 24 is unobstructed and cables 200 can be inserted there through. FIG. 5 shows a plurality of finger clips 50 having been positioned into the open position. In the closed position of the finger clip 50, the gap 24 is blocked or covered by the finger clip 50. Thus, cables 200 can be neither inserted nor removed from the cable routing aperture 22 via the gap 24 with the finger clip 50 in the closed position. FIG. 6 shows a plurality of finger clips 50 having been positioned into the closed position.

Figure 3:
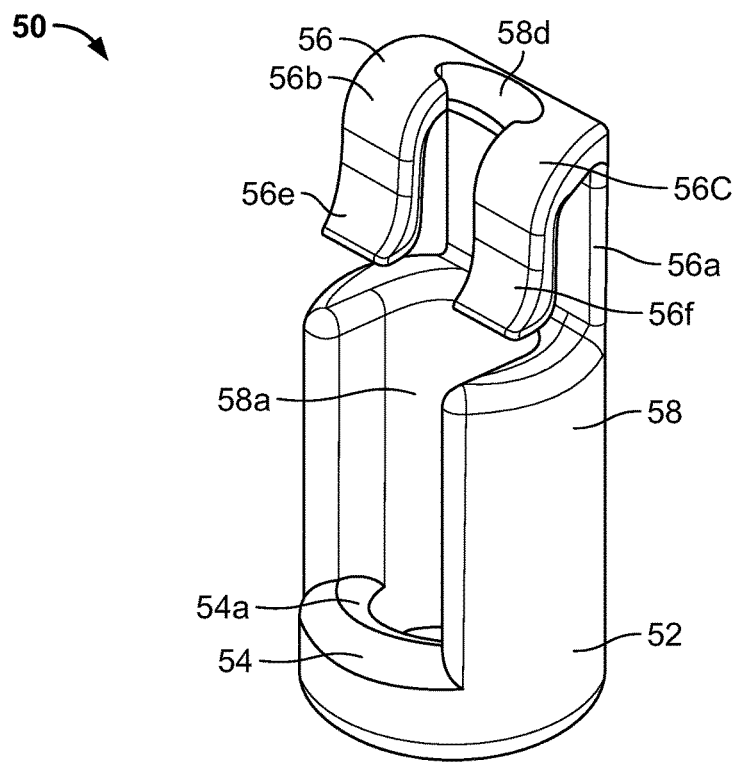
FIG. 3 is a top perspective view of a finger clip of the cable management assembly shown in FIG. 1.
Figure 4:
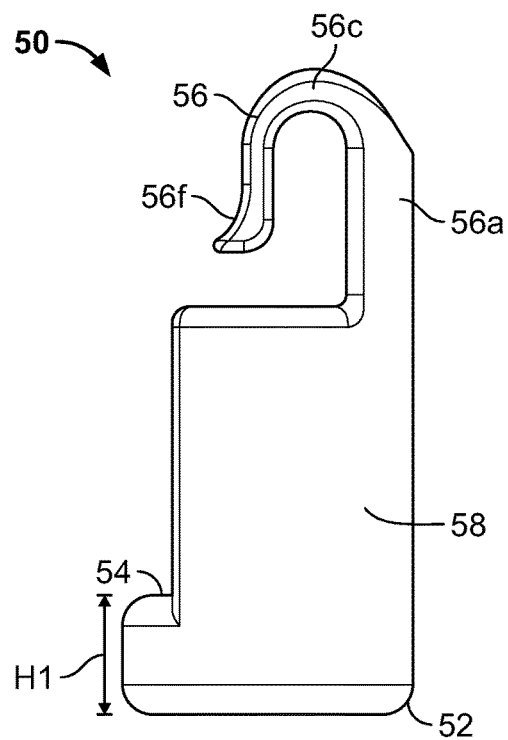
FIG. 4 is a side view of the finger clip shown in FIG. 3.

As most easily seen at FIGS. 3 and 4, the finger clip 50 can be configured as a singular, unitary component with a main body 52. The main body 52 can be formed of many different materials, for example a polymeric material. In one aspect, the main body 52 extends between a first end 52*a* and a second end 52*b* and defines an attachment portion 54, a position retaining portion 56, and an open channel portion 58.

In the example shown, the attachment portion 54 is configured as a closed ring 54*a* having an internal diameter equal to or slightly greater than that of the cable management member upper and lower extensions 18, 20. When the finger clip 50 is in the closed position, the closed ring 54*a* surrounds the upper extension 18 of a lower cable management member 12. Thus, in this position, the finger clip 50 is fully secured to the lower cable management member 12. In the open position, the closed ring 54*a* surrounds the lower extension 20 of an upper cable management member 12. Thus, in this position, the finger clip 50 is fully secured to the upper cable management member 12. The finger clip 50 can be removed from the cable management members 12 by positioning the closed ring 54*a* within the gap 24 between the cable management members 12. In one example, the closed ring 54*a* is provided with a height H1 that is greater than the opening dimension D1 of the gap 24. In such a case, one of the cable management members 12 must be laterally deflected first in order for the closed ring 54*a* to be released from the upper or lower extension 18, 20. Where the height H1 of the closed ring 54*a* is equal to or less than the opening dimension D1 of the gap 24, the closed ring 54*a* can be released from the upper or lower extension 18, 20 by aligning the closed ring 54*a* with the gap 24.

The open channel portion 58 is the portion of the main body 52 that physically blocks the gap 24 when the finger clip 50 is positioned in the closed position. In this position, both the upper and lower extensions 18, 20 are received within a recess 58*a* of the open channel 58. In the open position, the open channel portion 58 slides away from the upper extension 18 such that only the lower extension 20 is received within the open channel portion 58 to expose the gap 24. In one example, the attachment portion 54 and the open channel portion 58 could be combined into the same feature such that the open channel portion 58 provides for a sliding snap-fit connection onto the upper and lower extensions 18, 20 without the need for a closed ring 54*a*.

With continued reference to FIGS. 3 and 4, the position retaining portion 56 can be seen in greater detail. As shown, the position retaining portion 56 is formed as a first member 56*a* extending from the open channel portion 58 and a pair of clip members 56*b*, 56*c* that extend from the first member 56*a* and back towards the open channel portion 58. The clip members 56*b*, 56*c* pass on opposite sides of the lower extension member 20 of an upper cable management member 12 such that the lower extension member 20 is received by a recess 56*d* defined between the clip members 56*b*, 56*c*. The recess 56*d* can be configured to frictionally engage the lower extension member 20 such that the finger clip 50 remains in a position in which it is placed absent any additional forces. For example, this construction can enable the finger clip 50 to be sufficiently frictionally engaged with the cable management member 12 to remain in the open position such that an installer can route cables 200 through the gap 24 without having to simultaneously hold the finger clip 50 in the open position.

Engagement members 56*e*, 56*f* can also be respectively provided at the end of each of the clip members 56*b*, 56*c*. The engagement members 56*e*, 56*f* form a snap-fit or indexing type engagement with a protruding portion 21 of the lower cable management member 12 once the finger clip 50 has been fully moved into the closed position. This construction aids in ensuring that the finger clip 50 will remain in the closed position unless a predetermined opening force is applied to move the finger clip 50 out of the closed position and into the open position. In one example, the engagement members 56*e*, 56*f* are also configured to positively engage with the upper cable management member 12 to positively retain the finger clip 50 in the open position.

The process for installing and removing cables 200 into and out of the cable routing apertures 22 can be described as follows. In one step, the finger clip 50 is first moved into the open position to expose the gap 24, for example by sliding the finger clip 50 in a first direction D1. In another step, one or more cables 200 are inserted into the cable routing aperture 22 through the gap 24. In a final step, the finger clip 50 is moved into the closed position to close or block the gap 24, for example by sliding the finger clip 50 in a second direction D2 that is opposite of the direction D1. This process can be repeated for each cable routing aperture 22 and cable 200 in the telecommunications system 100.

Referring to FIGS. 5 and 6, an alternative embodiment of a finger clip 50' is shown in which the finger clip 50' is connected to both the upper and lower cable management members 12 via a snap-fit connection. In this arrangement, instead of being slidable, the finger clip 50' is retained in a fixed position relative to the cable management members 12. As shown, the finger clip 50' is formed with first, second, and third portions 52', 54', 56' that form a generally U-shape or generally trapezoidal shape defining a recess 58' within which the upper and lower extension members 18, 20 can be received. The second portion 54' can be provided with snap members 60' to enable the snap-fit connection. When access to the gap 24 is desired, the finger clip 50' can be removed from the adjacent cable management members 12 and later reinstalled once the desired number of cables 200 have been inserted and/or removed.

Various modifications and alterations of this disclosure will become apparent to those skilled in the art without departing from the scope and spirit of this disclosure, and it should be understood that the scope of this disclosure is not to be unduly limited to the illustrative embodiments set forth herein.

What is claimed is:

1. A finger clip for providing controlled cable access to a cable routing aperture through a gap defined between adjacent first and second cable management members, the finger clip comprising:
   (a) a main body extending from a first end to a second end;
   (b) an attachment portion formed as part of the main body, the attachment portion being constructed and arranged for slidable engagement with at least one of a first extension of the first cable management member and a second extension of the second cable management member such that the main body can slide between an open position in which the gap is unobscured by the main body and a closed position in which the gap is closed by the main body; and
   (c) a position retaining portion formed as part of the main body, the position retaining member being constructed and arranged to retain the finger clip in at least one of the closed position and the open position,
   wherein the attachment portion is forms a closed ring for receiving the first and second extensions,
   further comprising an open channel portion extending between the closed ring and the position retaining portion, the open channel portion receiving the first and second extensions.

2. The finger clip of claim 1, wherein the position retaining portion includes a pair of clip members between which a recess is formed for receiving the second extension.

3. The finger clip of claim 2, wherein the clip members include engagement portions constructed and arranged to engage with a portion of the first cable management member to positively retain the clip member in the closed position.

4. The finger clip of claim 1, wherein the finger clip is formed from a polymeric material.

5. A cable arrangement assembly for a telecommunications rack, the cable management assembly comprising:
   (a) a first cable management member defining a first extension;
   (b) a second cable management member defining a second extension, wherein the first and second cable management members together define a cable routing aperture that can be accessed by a cable through a gap defined between the first and second extensions; and
   (c) a finger clip slidably engaged with one or both of the first and second extensions and movable between an open position in which the gap is unobscured by the finger clip and a closed position in which the gap is closed by the finger clip, the finger clip including a main body defining:
      i) an attachment portion for securing the finger clip to the first and second extensions, the attachment portion forming a closed ring for receiving the first and second extensions;
      ii) a position retaining portion constructed and arranged to retain the finger clip in at least one of the closed position and the open position;
      iii) an open channel portion extending between the closed ring and the position retaining portion, the open channel portion receiving the first and second extensions.

6. The cable arrangement assembly of claim 5, wherein the finger clip includes a main body defining a position retaining portion constructed and arranged to retain the finger clip in at least one of the closed position and the open position.

7. The cable arrangement assembly of claim 6, wherein the position retaining portion includes a pair of clip members between which a recess is formed for receiving the first extension.

8. The cable arrangement assembly of claim 7, wherein the clip members include engagement portions constructed and arranged to engage with a portion of the first cable management member to positively retain the clip member in the closed position.

9. The cable arrangement assembly of claim 5, wherein the finger clip is formed from a polymeric material.

10. The cable arrangement assembly of claim 5, wherein the cable arrangement assembly includes a plurality of finger clips slidably engaged with a plurality of first and second cable management members.

11. The cable arrangement assembly of claim 5, wherein the closed ring has a height that is equal to or greater than an opening dimension of the gap.

12. A cable arrangement assembly for a telecommunications rack, the cable management assembly comprising:
   (a) a first cable management member defining a first vertical extension;
   (b) a second cable management member defining a second vertical extension coaxially aligned with the first vertical extension, wherein the first and second vertical cable management members together define a cable routing aperture accessible by a cable through a vertical gap defined between the first and second vertical extensions; and
   (c) a finger clip defining main body within which the first and second extensions are slidably received, the finger clip being slidable between an open position in which the gap is unobscured by the finger clip main body and a closed position in which the gap is closed by the finger clip main body wherein the main body defines an open channel receiving the first and second vertical extensions.

13. The cable arrangement assembly of claim 12, wherein the finger clip includes a main body defining a position retaining portion constructed and arranged to retain the finger clip in at least one of the closed position and the open position.

14. The cable arrangement assembly of claim 13, wherein the position retaining portion includes a pair of clip members between which a recess is formed for receiving the first extension.

15. The cable arrangement assembly of claim 14, wherein the clip members include engagement portions constructed and arranged to engage with a portion of the first cable management member to positively retain the clip member in the closed position.

16. The cable arrangement assembly of claim 12, wherein the finger clip is formed from a polymeric material.

* * * * *